United States Patent
Zhang et al.

(10) Patent No.: US 9,330,792 B2
(45) Date of Patent: May 3, 2016

(54) TESTING MEMORY DEVICES WITH DISTRIBUTED PROCESSING OPERATIONS

(71) Applicant: Advantest Corporation, Tokyo (JP)

(72) Inventors: Xinguo Zhang, Cupertino, CA (US); Ze'ev Raz, Los Gatos, CA (US); Ken Hanh Duc Lai, Sunnyvale, CA (US); Edmundo De La Puente, Cupertino, CA (US)

(73) Assignee: ADVANTEST CORPORATION, Tokyo (JP)

( * ) Notice: Subject to any disclaimer, the term of this patent is extended or adjusted under 35 U.S.C. 154(b) by 150 days.

(21) Appl. No.: 14/191,342

(22) Filed: Feb. 26, 2014

(65) Prior Publication Data

US 2015/0243370 A1     Aug. 27, 2015

(51) Int. Cl.
*G11C 29/56* (2006.01)

(52) U.S. Cl.
CPC ................. *G11C 29/56008* (2013.01)

(58) Field of Classification Search
CPC ....................................... G11C 29/56
USPC .......................................... 714/718
See application file for complete search history.

(56) References Cited

U.S. PATENT DOCUMENTS

| | | | | |
|---|---|---|---|---|
| 6,553,513 | B1* | 4/2003 | Swoboda | G06F 11/3656 714/25 |
| 2005/0138473 | A1* | 6/2005 | Mathew | G06F 11/2294 714/27 |
| 2008/0013565 | A1* | 1/2008 | Batchelor | H04L 12/413 370/445 |
| 2010/0017760 | A1* | 1/2010 | Kapur | G01R 31/318544 716/132 |
| 2013/0080983 | A1* | 3/2013 | Craig | G06F 17/5081 716/107 |

* cited by examiner

*Primary Examiner* — Fritz Alphonse

(57) ABSTRACT

Automated testing system and method of testing memory devices with distributed processing operations. A redundancy analysis system includes multiple test site processors (TSPs) respectively coupled to multiple devices under test (DUTs). Each TSP is installed with a redundancy analyzer configured to analyzing redundancy data returned from a respective (DUT). Each TSP may be coupled with a respective fail engine for returning the redundancy data from the corresponding DUT. A main TSP of the multiple TSPs is configured to control testing routine over the multiple DUTs and process failure related data from the DUTs. The main TSP may direct the RAs distributed in the multiple TSPs to execute the redundancy analyzers in parallel.

20 Claims, 5 Drawing Sheets

Example Redundancy Analysis System 300

TESTING MEMORY DEVICES WITH DISTRIBUTED PROCESSING OPERATIONS

BACKGROUND

Embodiments of the present invention relate generally to automated semiconductor testing. More particularly, an example embodiment of the present invention relates to testing memory devices.

BACKGROUND

Automated test equipment (ATE) performs high speed testing on semiconductor devices to verify that the devices function properly during and after their manufacturing processes. Some ATE specialize in testing memory devices. Typical ATE systems input a pattern of test signals to a device under test (DUT), measure various test parameters relating to the input data signals and compute an evaluation of the measurements and output data, which relate to analyzing the computed evaluation.

ATE systems may comprise automatic electromechanical probe, interface and adapter components. ATE systems may also comprise robotic handler components, which load and arrange multiple DUTs (e.g., mass-produced semiconductor devices) into the ATE at once, unload the tested devices and sort them by quality based on their test results. ATE improves test throughput and thus reduce the amount of time required to perform accurate testing, evaluation and handling of significant numbers of devices at once, which improves manufacturing yield and quality and reduces the costs of producing reliable semiconductor devices. An ATE system may specialize in testing memory.

ATE memory testing is performed using complex, computer-based test algorithms to detect memory faults during the final packaging stages of producing various types of memory devices. "Flash" memory comprises an erasable and reprogrammable non-volatile data storage medium with fast access time for computers, telephones, cameras and other portable or mobile electronics.

NAND (NOR/AND) type flash memory is page based, uses consecutive read operations in its input/output (I/O) ports and is less expensive and longer lasting (e.g., in relation to write and erase cycles) than NOR type flash memory, which uses random access and is typically used with computer BIOS (basic input/output system), firmware and other rarely updated applications. Redundancy analysis (RA), also referred to as "repair analysis," of NAND flash memory comprises a significant function of their testing and feature of memory ATE, also referred to herein as a memory tester.

For example, NAND flash memories comprise at least a main block of memory cells and at least a spare block of memory cells, each of which functions with its own page buffer unit. The memory tester writes one or more given patterns of digital test signals to each cell of the main cell block through the main page buffer and reads the test pattern back out therefrom to detect any errors, which would each indicate a defective cell. The spare block of memory cells provide redundancy for the cells of the main block of cells.

A repair controller is operable to map cell addresses in the spare block with the main block address of a failed cell therein and outputs a redundancy (e.g., repair) control signal to direct data writes to the spare cells, in lieu of writes to the failed mail block cell to which the spare block address was mapped. The repair controller may be operable for optimizing the mapping between the main block and the spare block, thus increasing the degree of redundancy. RA thus allow a memory tester to evaluate and analyze the self-repair capability of NAND flash DUTs, which may significantly improve the yield and quality of their manufacture and production.

Test performance (e.g., speed and throughput) and cost comprise significant factors in RA. High NAND flash test throughput may be provided by tester-per-site ATE comprising multiple test sites, in each of which a single DUT is tested. Each of the multiple test sites has its own independent test resources, which comprise a testing processor, an algorithmic test pattern generator, parametric measurement units, buffer memory and fail memory.

Conventionally, RA is performed within a device main test program. This approach adds latency however, as the main test program devotes its resources to computing RA over a given cell before switching to the next cell to be tested. To reduce test latency and thus improve performance, some memory testers comprise a dedicated processor to compute the RA. However, this approach adds the cost of the additional RA processor to the expense of the testing.

Approaches described in this section may, but have not necessarily been conceived or pursued previously. Unless otherwise indicated, approaches mentioned (or issues identified in relation thereto) should not to be assumed as recognized in any prior art merely by inclusion in this section.

SUMMARY

It would be useful to improve the performance of a memory test system without the added expense and complexity of additional or dedicated processor hardware. In particular, it would be useful to improve the speed and throughput of redundancy analysis (RA) without using a dedicated additional processor in its computation.

An embodiment of the present invention relates to automated test equipment (ATE) operable for testing one or more (e.g., multiple) memory devices with distributed processing operations. For example, an ATE apparatus comprises a system operable for performing redundancy analysis (RA) over NAND flash memory devices. The RA system comprises a first test site processor (TSP), which is operable for controlling a testing routine over multiple devices under test (DUTs) and analyzing redundancy data returned from a first of the multiple DUTs. The RA system comprises at least a second TSP, operable for analyzing redundancy data returned from a second of the DUTs. The RA system may also have one or more (e.g., 3-4 or more) additional TSPs, each operable for analyzing redundancy data returned from an additional DUT. Controlling the testing routine comprises directing the RA in each of the first and second (and any/all of the additional) TSPs.

Thus, an example embodiment of the present invention improves the performance of a memory test system without adding expense and complexity of additional, dedicated processor hardware. An example embodiment is operable for improving the speed and throughput of RA without requiring a dedicated additional or external processor or other components in its computation.

BRIEF DESCRIPTION OF THE DRAWINGS

An embodiment of the present invention relates to testing of memory devices with distributed processing operations. The accompanying drawings below comprise a part of the specification herein of example embodiments of the present invention and are used for explaining features, elements and attributes thereof. Principles of example embodiments are described herein in relation to each figure (FIG.) of these drawings, in which like numbers are used to reference like items, and in which.

Figure 1:
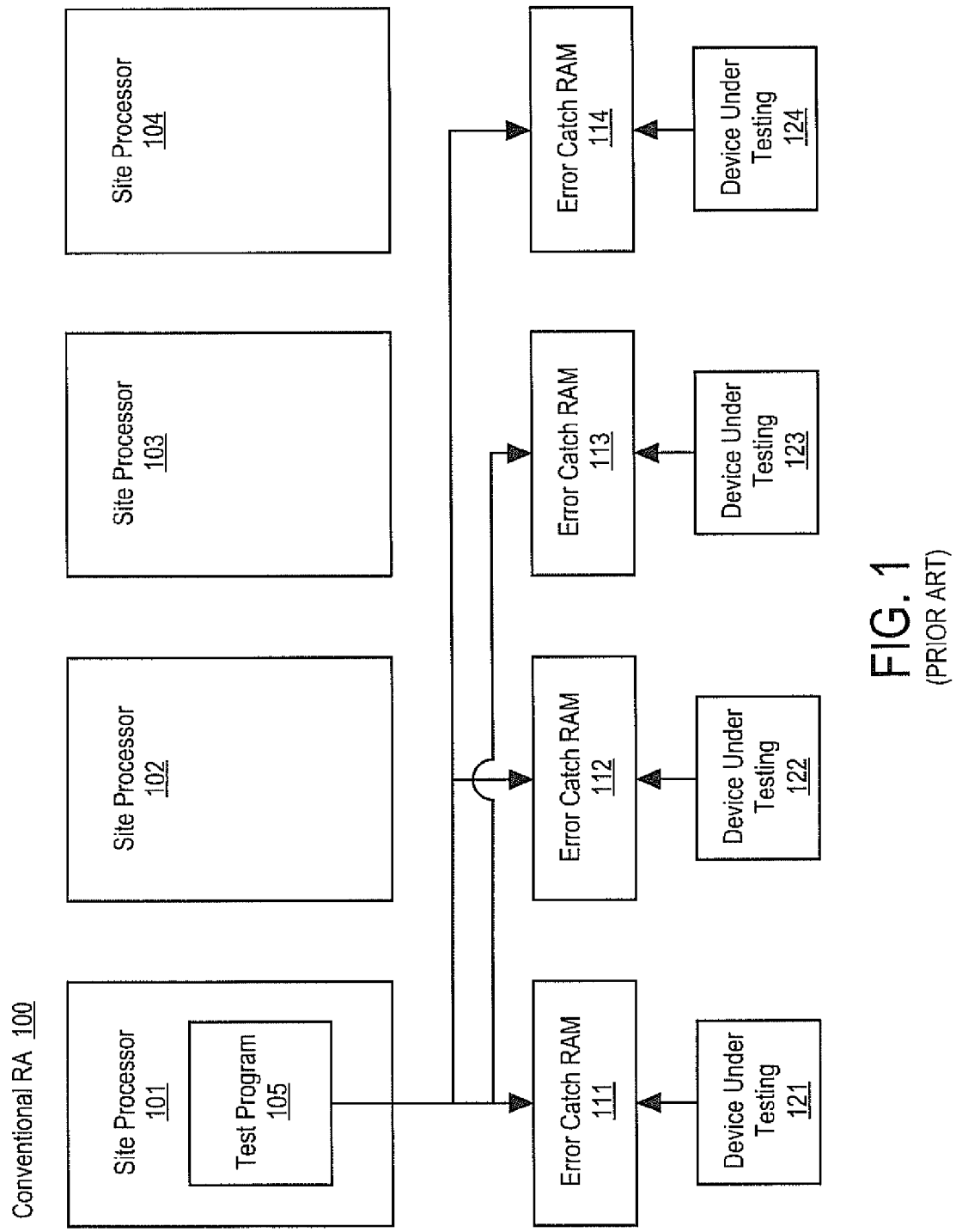
FIG. 1 depicts a conventional serial redundancy analysis (RA) system.

No particular scale applies in these figures, unless stated otherwise.

DESCRIPTION OF EXAMPLE EMBODIMENTS

An embodiment of the present invention relates to testing memory devices with distributed processing operations. Reference will now be made in detail to implementations of the example embodiments as illustrated in the accompanying drawings. The same reference numbers will be used to the extent possible throughout the drawings and the following description to refer to the same or like items. It should be apparent to artisans of ordinary skill in technologies that relate to testing memory and other semiconductor devices however, that example embodiments of the present invention may be practiced without some of these specifically described details. Example embodiments of the present invention are described in relation to a redundancy analysis (RA) system for use in ATE apparatus and operable for testing NAND flash memory with distributed processing operations.

For focus, clarity and brevity, as well as to avoid unnecessarily occluding, obscuring, obstructing or obfuscating features that may be somewhat more germane to, or significant in explaining example embodiments of the present invention, this description may avoid describing some well-known processes, structures, components and devices in exhaustive detail. Artisans of ordinarily skilled in semiconductor related technologies should realize that the following description is made for purposes of explanation and illustration and is not intended to be limiting in any way. On the contrary; other embodiments should readily suggest themselves to artisans of such skill in relation to the example features and elements described herein and any corresponding benefits such embodiments may achieve. An example embodiment of the present invention is described in relation to a RA system for use in ATE and operable for testing NAND flash memory devices with distributed processing operations.

While embodiments are described herein with reference to an example RA system, it should be appreciated that this is by way of illustration, example, clarity, brevity and simplicity of description. Moreover, artisans of ordinary skill in arts relating to testing technologies for memories and other semiconductor devices should especially appreciate and understand that the scope of embodiments of the present invention thus covers semiconductor devices more generally than described herein and more particularly, to other integrated circuit (IC) devices that are not dissimilar thereto.

An embodiment of the present invention relates to testing of memory devices with distributed processing operations. An ATE apparatus has an RA system operable for performing RA testing with distributed processing operations over NAND flash memory devices. The RA system comprises a first test site processor (TSP), which is operable for controlling a testing routine over multiple devices under test (DUTs) and analyzing redundancy data returned from a first of the multiple DUTs. The RA system comprises at least a second TSP, operable for analyzing redundancy data returned from a second of the DUTs. The RA system may also have one or more additional TSPs, each operable for analyzing redundancy data returned from an additional DUT. Controlling the testing routine comprises directing the RA in each of the first and second (and any of the additional) TSPs.

Typical conventional approaches perform RA within a ATE device main test program. This approach adds latency however, as the main test program devotes its resources to computing RA over a given cell before switching to the next cell to be tested. To reduce test latency and thus improve performance, some conventional memory testers comprise a dedicated processor to compute the RA. However, this approach adds the cost of the additional RA processor to the expense of the testing.

For example, FIG. 1 depicts a conventional serial RA system 100. The conventional RA system 100 has a first TSP 101, which runs a test controller program 105. The test controller program 105 controls error catch random access memory (RAM) components 111-114. The error catch RAM 111-114 each capture failure related data from respective DUTs 211-124 and transmit the captured fail data serially back to the test controller program 105 for processing in the first TSP 101.

In contrast to an example embodiment of the present invention, one or more of the TSPs 102-104 remain idle in relation to processing any of the redundancy data, which is computed solely by the test controller program 105. In fact, the one or more TSPs 102-104 may remain idle for any substantive part advancing the conduct of testing over each of their respective local DUTs 122-124 until the test controller program 105 completes processing all RA computations previously undertaken therewith in relation to error data loaded previously from any of the error catch RAM 111-114.

Figure 2:
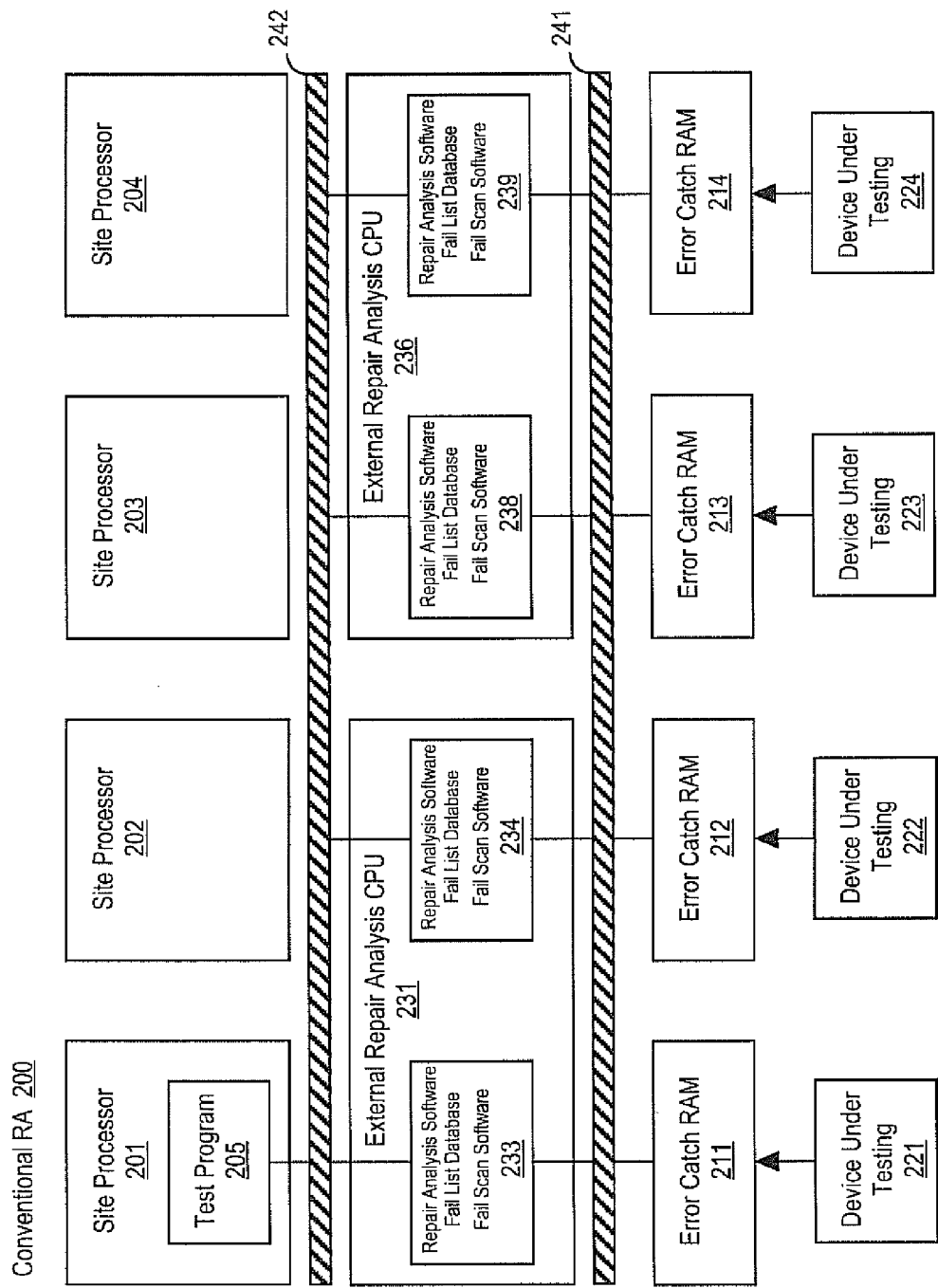
FIG. 2 depicts a conventional RA system with external RA processing hardware components.

FIG. 2 depicts a conventional RA system 200 with external RA processing hardware components. The conventional RA system 200 has a first TSP 201, which runs a test controller program 205. The test controller program 205 controls error catch RAM components 211-214. The error catch RAM 211-214 each capture failure related data from respective DUTs 221-224. The error catch RAM 211-214 transmit the captured fail data serially back to the test controller program 205 for processing in the first TSP 201. The transmission of the captured fail data is made through external hardware components.

The external hardware components include external RA processors 221 and 236, which unload the processing tasks related to computation of redundancy analysis from the test controller program 205 in the first TSP 201 and relieve the controller to perform other processing tasks. The external RA processor 221 has redundancy analyzers 223 and 224. The external RA processor 236 has redundancy analyzers 238 and 239. The redundancy analyzers 223, 224, 238 and 239 are each programmed with RA software, which include fail scan control software and a fail list database. An adapter interface 241 respectively couples error catch RAM 211, 212, 213 and 214 to the redundancy analyzers 223, 224, 238 and 239 for the transfer of error data thereto, which has been captured respectively from DUTs 221, 222, 223 and 224.

An adapter interface 242 couples each of the redundancy analyzers 223, 224, 238 and 239 serially, via a single network interface port 245. Thus, while the external RA processors 221 and 236 unload the processing tasks related to computation of redundancy analysis from the test controller program 205 in the first TSP 201 and relieve the controller to perform other processing tasks, it does so only with the added complexity and expense of the additional external components, adapters and interfaces and the single serial network port 245 may still comprise a bottleneck to optimally improving test speed and throughput.

Example System

Figure 3:
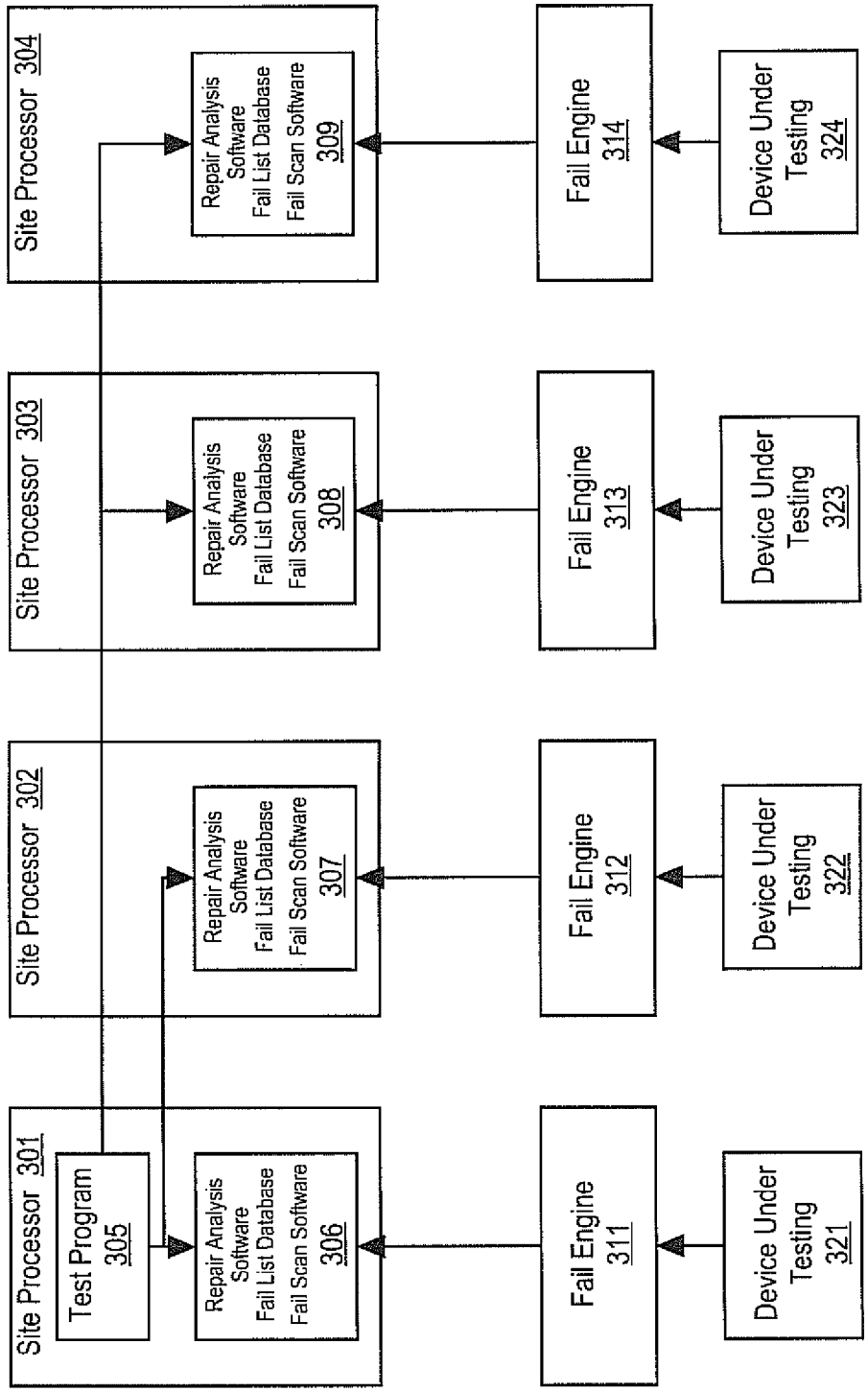
FIG. 3 depicts an example RA system, according to an embodiment of the present invention

FIG. 3 depicts an example RA system 300, according to an example embodiment of the present invention. The RA system 300 has a distributed configuration, which may be used in automated testing of NAND flash memory devices. The RA system 300 comprises a first test site processor (TSP) 301. The first TSP 301 comprises a main test program controller 305. The test program controller 305 is operable for controlling a testing routine over multiple devices under test (DUTs 321-324).

The first TSP also comprises a redundancy analyzer 306, which may comprise a software program. The redundancy analyzer 306 is operable for analyzing redundancy data returned from a first DUT 321 of the multiple DUTs (321-324). The RA system 300 comprises multiple TSPs 302-304. The TSP 302 comprises a redundancy analyzer 307. The redundancy analyzer 307 is operable for analyzing redundancy data returned from a second DUT 322 of the multiple DUTs.

An example embodiment may be implemented in which the RA system 300 has additional TSPs, e.g., a third TSP 303 and a fourth TSP 304. The third TSP 303 has a redundancy analyzer 308. The redundancy analyzer 308 is operable for analyzing redundancy data returned from a third DUT 323 of the multiple DUTs. The fourth TSP 304 has a redundancy analyzer 309. The redundancy analyzer 309 is operable for analyzing redundancy data returned from a fourth DUT 324 of the multiple DUTs.

The test controller 305 of TSP 301 is operable for exercising control over the testing routine, which may also comprise directing the RA performed in each of the redundancy analyzers 306-309 of the TSPs 301-304, respectively, e.g., with commands and/or programming. As the RA computations are performed in each of the redundancy analyzers 306-309 however, an embodiment of the present invention frees up the main test controller 305 for performing other processing tasks, operations and computations.

An example embodiment is implemented in which the single test controller 305 of the TSP 301 runs a test control program, e.g., control software. The test control program directs the parallel execution, by local software running on the processors of the each of TSPs 101-104, inclusive, which controls and executes the computing of the RA on each of the TSPs under local control. In this fashion, an example embodiment is operable to execute all of the RA computation software in parallel, to share the overall workload over each of the TSPs 301-304, inclusive, for processing the fail data captured from their respective DUTs.

An example embodiment may be implemented in which the RA system 300, further comprises multiple fail engines (e.g., 311-314). The multiple fail engines comprise a first fail engine 311 coupled to the first TSP 301. The first fail engine 311 is operable for returning the redundancy data from the first DUT 321 to the redundancy analyzer 306. At least a second fail engine 132 is coupled to the at least second TSP 302. The second fail engine 132 is operable for returning the redundancy data from the second DUT 322 to the redundancy analyzer 307.

Distributiveness of the RA system 300 is scalable. For example, a third fail engine 313 may couple a third DUT 323 to the redundancy analyzer 308 of TSP 303 and a fourth fail engine 314 may couple a fourth DUT 324 to the redundancy analyzer 309 of TSP 304, etc.

The control exerted over the testing routine comprises directing, e.g., with commands and/or programming, each of the redundancy analyzers 306-309 in each of the TSPs 301-304, respectively. The multiple DUTs 321-324 may comprise NAND flash memory devices. Each of the NAND memory devices comprises a main storage block having a plurality of individually addressable memory cells and at least one spare storage block having a plurality of individually addressable memory cells. Upon a failure of one or more cells of its main storage block, the NAND flash memory device is operable for self-repair, which maps failed main block cell addresses to one or more of the plurality of spare block memory cells, and directs data writes thereto in lieu of (e.g., instead of) to the failed cells of the main block to which they are respectively mapped.

This self-repair operability (self-reparability) thus effectively replaces the one of the one or more failed cells of the main storage block from available storage cells of the spare block. The self-reparability may be directed by a process to optimize the matching between failed cells of the main block and replacement cells from the spare block, based on an amount of data to be written and e.g., computing a knapsacking or similar algorithm over an current availability and configurability of spare block storage capacity. Other parameters may be considered as well, such as a read latency of a given amount of data as stored in a particular configuration and a temporal value, volatility or vulnerability, which may be associated with certain data in view of such parameters.

Thus, an example embodiment may be implemented in which the redundancy analyzers 306-309 measure, characterize and evaluate the degree of cell failure in the main storage block, map the replacement of main storage block failed cells to the spare block memory cells with which the failed cells are replaced, compute an optimized replacement of failed main storage block cells and track a degree to which the spare storage block retains an availability of cells for further repair, e.g., replacing subsequent failures of main block memory cells.

More specifically, the redundancy analyzers 306-309 evaluate the redundancy data in each of the TSPs 301-304, respectively, by controlling a scan over the main storage block and the spare storage block. The redundancy analyzers 306-309 are programmed with failure processing software on each of the TSPs 301-304, respectively. The failure processing software comprises a failure database, a repair analysis module, a fail list query and a management interface, which supports running an analysis plug-in program preferred by a user of ATE in which RA system 300 is disposed. The fail scan software programs the redundancy analyzers 306-309 for collecting a fail list from each of their respective local fail engines over a high speed bus such as a PCIe (Peripheral Component Interconnect-express) interface.

During functional testing of NAND flash DUTs, the fail scan software controls the redundancy analyzers 306-309 to read a fail list from each of their respective local fail engines 311-314, evaluate corresponding repair analyses, and stores the fail lists and repair analysis into the fail database. The fail software may thus discard a fail address on bad (e.g., defective) blocks and columns of the pages comprising the main storage blocks of the NAND flash DUTs. The fail database may also support overlay operations to merge results from multiple tests. The fail list can be retrieved by the main test controller 305 from one or more of the multiple redundancy analyzers 306-309 at any time.

In an example embodiment, the RA system 300 comprises a tester-per-site architecture, e.g., a test configuration with multiple site processors 301-304. An instance of the master test controller 305 may be programmed to run testing in different modes. In a combined resource mode (CRMn, wherein n represents an integer greater than one), the master test controller 305 is programmed to control resources of the multiple TSPs. In CRM2 for example, the master test controller controls TSP 301 and TSP 302; in CRM3 the master test controller controls TSP 301, TSP 302 and TSP 303 and in CRM4, the master test controller controls TSPs 301-304, etc.

For CRMn, in which n equals or exceeds two, the master test controller 305 is programmed to run on the single "master" TSP 301. However, no master test controller runs on the other "slave" TSPs 302-304, which thus remain idle in relation to running a master test control program. In an example embodiment of the present invention, the RA system 300 thus presents a distributed configuration. The distributed configuration leverages otherwise idle processing resources of the slave TSPs 302-304, etc. to capture errors and compute repair analyses, which would otherwise burden the master test controller and add latency to its functionality and thus reduce throughput and other test performance.

Failure related process data is thus provided to each of the redundancy analyzers 306-309 from their respective corresponding local fail engine 311-314. An example embodiment of the present invention thus obviates the sending of fail information to a master TSP or to an external repair analysis processor via a network interface, which saves the transmission time required in conventional approaches, cuts that associated latency from the repair analysis process and thus increases testing throughput. In contrast, access of the local redundancy analyzers 306-309 to local fail engines through a high speed PCIe bus interface. Thus, example embodiments obviate multiple fail engines sharing a single network port to send a fail list to an external processor for analysis as in a conventional approach.

The analyses of the repair related data in the redundancy analyzers 306-309 of each of the respective TSPs 301-304 comprises, upon detecting one or more failed cells in the main storage block, listing a failure list. The failure list maps between each of the failed cells in the main storage bank of the NAND flash memory DUT and the cells of the spare storage block, with which they are repaired.

An example embodiment may be implemented in which the RA system 300 comprises an integrated component, disposed within an ATE apparatus.

Example Processes

Figure 4:
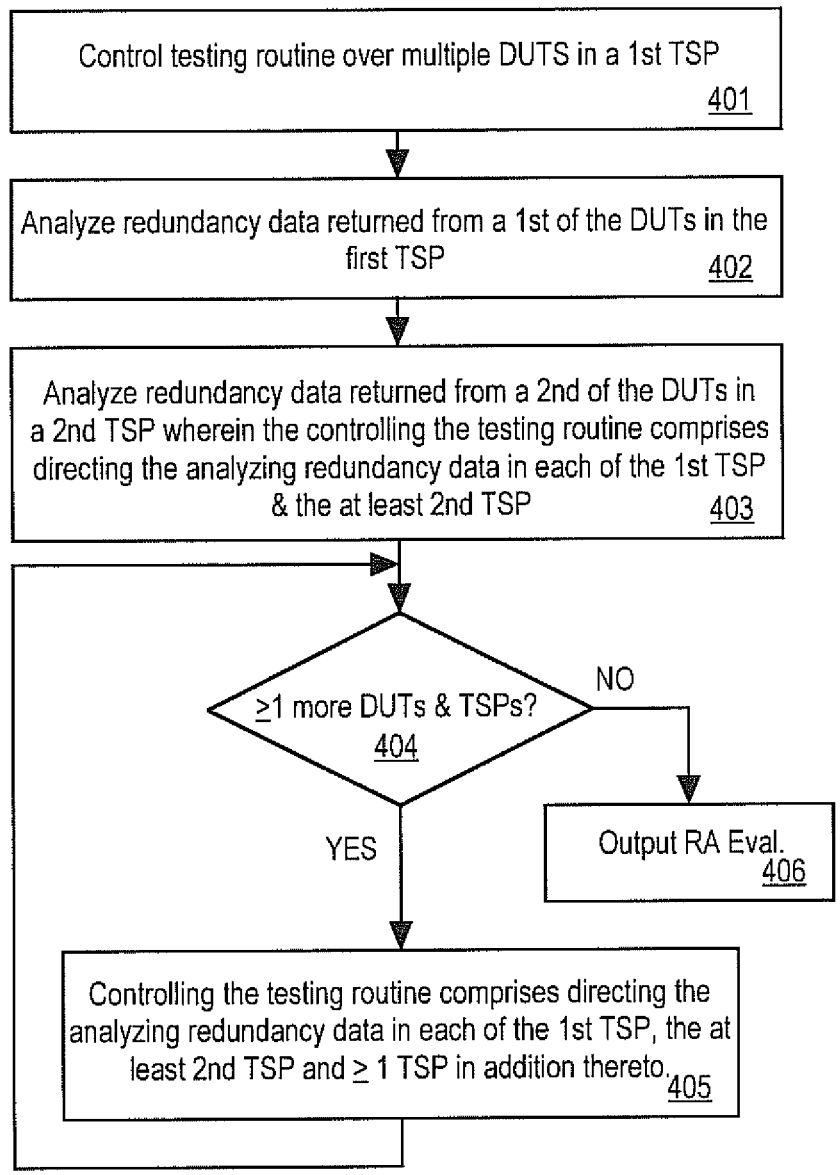
FIG. 4 depicts a flowchart for an example RA process, according to an embodiment of the present invention.

FIG. 4 depicts a flowchart for an example RA process 400, according to an embodiment of the present invention. RA process 400 determines a redundancy characteristic of multiple DUTs and may be performed by a RA system (e.g., RA system 100; FIG. 1). The DUTs may comprise NAND flash memory devices.

In step 401, a testing routine is controlled over a plurality of the devices under test in a first TSP (e.g., TSP 101).

In step 402, redundancy data returned from a first of the plurality of DUTs (e.g., DUT 121) is analyzed in the first TSP.

In step 403, redundancy data returned from a second of the plurality of DUTs (e.g., DUT 122) in a second TSP (e.g., TSP 102). The controlling the testing routine of step 401 comprises directing the analyzing of the redundancy data in each of the first TSP and the at least second TSP. For example, a main test controller (e.g., main test controller 105; FIG. 1) may program the redundancy analyzers (e.g., redundancy analyzers 106 and 107).

In step 404, it may be determined whether one or more additional DUTs (e.g., DUTs 123 and/or 124) are to be tested by their respective corresponding local TSPs (e.g., TSPs 103, 104, respectively). If so, then in step 405, the controlling of the testing routine of step 401 further comprises directing the analyzing of the redundancy data in each of the first TSP, the at least second TSP and the one or more TSPs in addition thereto (e.g., TSP 103 and/or 104) and the determination step 404 subsequently repeated. If not however, an evaluation of the redundancy analysis may comprise an output of the test process 400.

Figure 5:
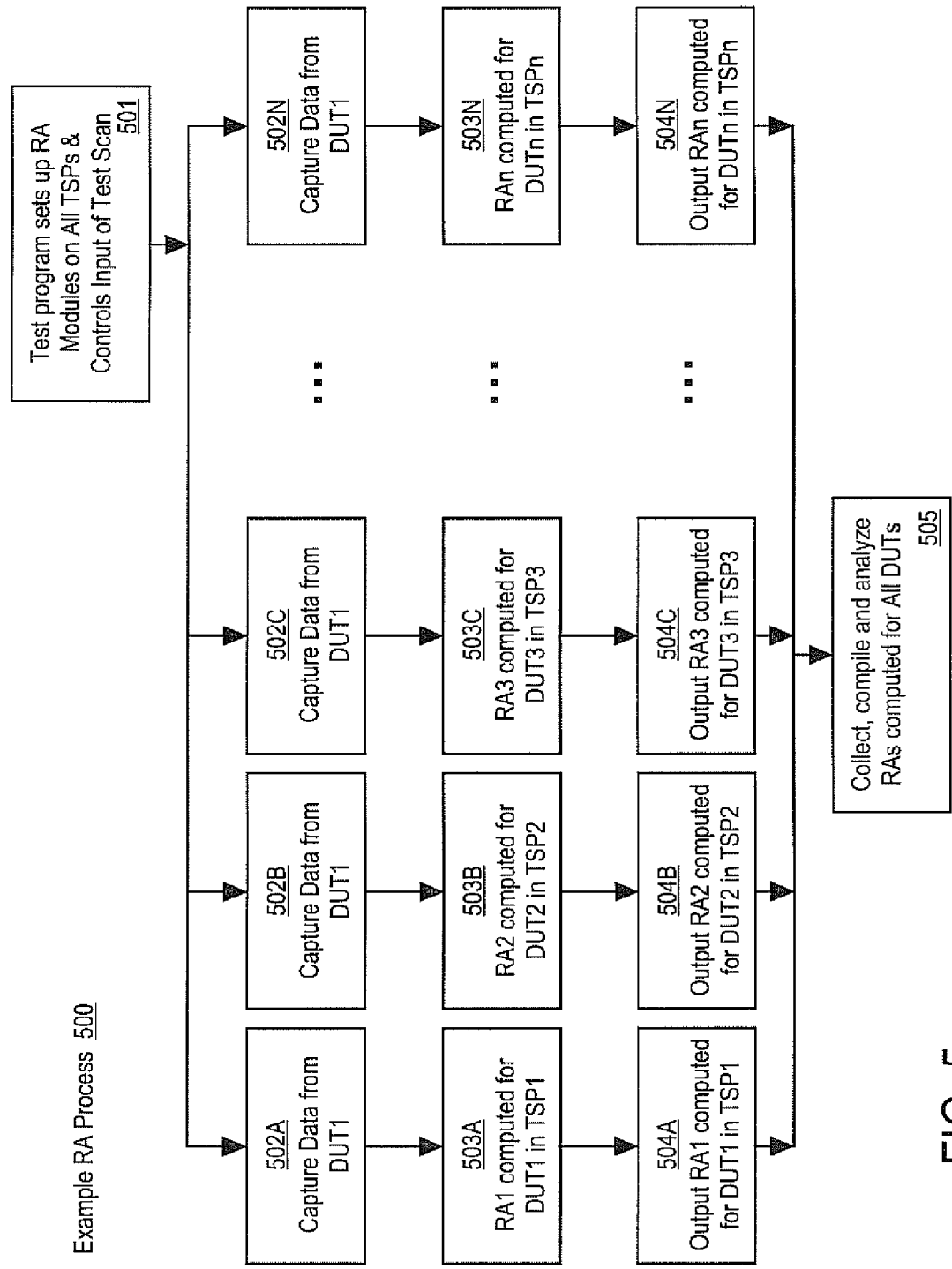
FIG. 5 depicts a flowchart for an example RA process, according to an embodiment of the present invention.

FIG. 5 depicts a flowchart for an example RA process 500, according to an embodiment of the present invention. RA process 400 determines a redundancy characteristic of multiple DUTs and may be performed by a RA system (e.g., RA system 100; FIG. 1). The DUTs may comprise NAND flash memory devices.

In step 501, a test program sets up (programs) RA modules, which run on all, e.g., each of TSP1, TSP2, TSP3, . . . TSPn and controls the input of a test scan (e.g., a pattern of test data signals) to each of respectively corresponding DUTs, DUT1, DUT2, DUT3, . . . DUTn.

In step 502A, the TSP1 captures failure related test data ("test data") from DUT1. In step 502B, the TSP2 captures test data from DUT2; in step 502C, the TSP3 captures test data from DUT3; . . . ; and in step 502N, the TSPn captures test data from DUTn. In an example embodiment of the present invention, the processing operations relating to one or more (e.g., all) of steps 502A-502N, inclusive, execute in parallel (e.g., substantially at the same time or over the same time period) as each other.

In step 503A, the RA module-1 of TSP1 computes the RA1 for DUT1 from the captured test data. In step 503B, the RA module-2 of TSP2 computes RA2 for DUT2 from the captured test data; in step 503C, the RA module of TSP3 computes RA3 for DUT3 from the captured test data; . . . ; and in step 503N, the RA module-N of TSPn computes RAn for DUTn from the captured test data. In an example embodiment of the present invention, the processing operations relating to one or more (e.g., all) of steps 503A-503N, inclusive, execute in parallel with (e.g., substantially at the same time as, or over the same time period as) each other.

In step 504A, the TSP1 outputs the computed RA1 for DUT1. In step 504B, the TSP2 outputs the computed RA2 for DUT2; in step 504C, the TSP3 outputs the computed RA3 for DUT3; . . . ; and in step 504N, the TSPn outputs the computed RAn for DUTn. In an example embodiment of the present invention, the processing operations relating to one or more (e.g., all) of steps 504A-504N, inclusive, execute in parallel (e.g., substantially at the same time or over the same time period) as each other.

In step 505, the RA outputs from each of the TSP1, TSP2, TSP3, . . . , TSPn, inclusive, are collected and a failure list, which may grow over test time, is compiled and analyzed. An example embodiment may be implemented in which portions of the RA process 400 (FIG. 4) and/or RA process 500 (FIG. 5) is controlled with one or more non-transitory computer readable storage media comprising instructions for causing one or more processors to perform computations relating to a analyzing the redundancy characteristics of the NAND flash memory DUTs. For example, the main test controller 105 (FIG. 1) may program the redundancy analyzers 106-109 with encoded RA software including the fail scan controller algorithm and the fail list database to allow the TSPs 101-104 to process the computations for evaluating the redundancy characteristics of their respective local DUTs 121-124.

Thus, an example embodiment of the present invention is described in relation to testing of memory devices with distributed processing operations. A RA system in ATE performs redundancy analysis over NAND flash memory devices. The RA system comprises a first TSP, which is operable for controlling a testing routine over multiple DUTs and analyzing redundancy data returned from a first of the multiple DUTs. The RA system comprises at least a second TSP, operable for analyzing redundancy data returned from a second of the DUTs. The RA system may also have one or more additional TSPs, each operable for analyzing redundancy data returned from an additional DUT. Controlling the testing routine comprises directing the RA in each of the first and second (and any of the additional) TSPs.

Thus, an example embodiment of the present invention improves the performance of a memory test system without adding expense and complexity of additional, dedicated processor hardware. An example embodiment is operable for improving the speed and throughput of RA without requiring a dedicated additional processor in its computation.

Definitions that are expressly set forth in each or any claim specifically or by way of example herein, for terms contained in relation to features of such claims are intended to govern the meaning of such terms. Thus, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A system for analyzing a redundancy characteristic of a device under test, the system comprising:
    a first test site processor, the first test site processor operable for executing program instructions for:
        controlling a testing routine over a plurality of the devices under test; and
        analyzing redundancy data returned from a first of the plurality of devices under test; and
    at least a second test site processor; the at least second test site processor operable for executing program instructions for analyzing redundancy data returned from a second of the plurality of devices under test, wherein the controlling the testing routine comprises directing the analyzing redundancy data in each of the first test site processor and the at least second test site processor.

2. The system as recited in claim 1, further comprising a plurality of fail engines, each of which is associated with a respective test site processor and is operable for collecting the redundancy data from a corresponding one of the devices under test and returning the collected redundancy data to a corresponding one of the first test site processor or the at least second test site processor.

3. The system as recited in claim 2 wherein the plurality of fail engines comprises:
    a first fail engine coupled to the first test site processor and operable for returning thereto the redundancy data from the first of the plurality of devices under test; and
    at least a second fail engine coupled to the at least second test site processor and operable for returning thereto the redundancy data from the second of the plurality of devices under test.

4. The system as recited in claim 3, further comprising a plurality of test site processors wherein the plurality of test site processors comprises the first test site processor, the second test site processor and one or more test site processors in addition thereto.

5. The system as recited in claim 4 wherein the plurality of devices under test comprises the first device under test, the at least second device under test and one or more devices under test in addition thereto.

6. The system as recited in claim 5 wherein each of the one or more additional test site processors is operable for executing program instructions for analyzing redundancy data returned from one of the one or more additional devices under test.

7. The system as recited in claim 6 wherein the plurality of fail engines comprises the first fail engine, the at least second fail engine and one or more fail engines in addition thereto, wherein the one or more additional fail engines are each coupled respectively to the one or more additional test site processors and operable for returning thereto the redundancy data from one of the one or more additional devices under test.

8. A method for analyzing a redundancy characteristic of a device under test, the method comprising:
    controlling a testing routine over a plurality of the devices under test in a first test site processor;
    analyzing redundancy data returned from a first of the plurality of devices under test in the first test site processor; and
    in parallel with the analyzing the redundancy data returned from the first of the plurality of devices under test, analyzing redundancy data returned from a second of the plurality of devices under test in a second test site processor, wherein the controlling the testing routine comprises directing the analyzing redundancy data in each of the first test site processor and the at least second test site processor.

9. The method as recited in claim 8, further comprising:
    returning the redundancy data from the first of the plurality of devices under test to the first test site processor; and
    returning the redundancy data from the at least second of the plurality of devices under test to the at least second test site processor.

10. The method as recited in claim 8 wherein the controlling the testing routine comprises directing the analyzing redundancy data in each of the first test site processor, the at least second test site processor and one or more test site processors in addition thereto.

11. The method as recited in claim 10 wherein the plurality of devices under test comprises the first device under test, the at least second device under test and one or more devices under test in addition thereto.

12. The method as recited in claim 11, further comprising returning the redundancy data from the one of the one or more additional devices under test to one of the one or more additional test site processors.

13. The method as recited in claim 12 wherein each of the plurality of devices under test comprises a NAND flash memory device, the NAND memory device comprising a main storage block of a plurality of individually addressable memory cells and a spare storage block of a plurality of individually addressable memory cells wherein, upon a failure of one or more cells of the main storage block, the device is operable to address one or more of the plurality of spare block memory cells to each replace one of the one or more failed cells of the main storage block.

14. The method as recited in claim 13, wherein the redundancy data relates to a mapping between the one or more of the plurality of spare block memory cells in the replacement of the failed cell of the plurality of main block memory cells.

15. The method as recited in claim 14 wherein the analyzing the redundancy data in each of the plurality of site processors comprises:
    controlling a scan over the main storage block and the spare storage block; and
    upon detecting one or more failed cells in the main storage block, listing a failure list wherein the failure list comprises the mapping.

16. A testing system, comprising:
- a plurality of test site processors units, wherein each test site processor unit comprises a respective processor and a respective redundancy analysis software module for computing redundancy analysis operations on data from a respective device under test; and
- a plurality of fail engines, wherein each fail engine is coupled to a respective test site processor unit and further operable to be coupled to a respective device under test, wherein a first test site processor unit comprises a test program for coordinating the execution of redundancy analysis operations across the plurality of test site processors, wherein each redundancy analysis software module is executed by a respective processor of the plurality of test site processor units and wherein further, the redundancy analysis software modules of the plurality of test site processor units execute operations in parallel.

17. The system as recited in claim 16, wherein each of the plurality of devices under test comprises a NAND flash memory device, the NAND memory device comprising a main storage block of a plurality of individually addressable memory cells and a spare storage block of a plurality of individually addressable memory cells.

18. The system as recited in claim 17 wherein, upon a failure of one or more cells of the main storage block, the device is operable to address one or more of the plurality of spare block memory cells to each replace one of the one or more failed cells of the main storage block.

19. The system as recited in claim 17, wherein the redundancy data relates to a mapping between the one or more of the plurality of spare block memory cells in the replacement of the failed cell of the plurality of main block memory cells.

20. The system as recited in claim 19 wherein the analyzing the redundancy data in each of the plurality of site processors comprises:
- controlling a scan over the main storage block and the spare storage block; and
- upon detecting one or more failed cells in the main storage block, listing a failure list wherein the failure list comprises the mapping.

* * * * *